United States Patent
Lai et al.

(10) Patent No.: US 6,661,273 B1
(45) Date of Patent: Dec. 9, 2003

(54) SUBSTRATE PUMP CIRCUIT AND METHOD FOR I/O ESD PROTECTION

(75) Inventors: Chun-Hsiang Lai, Taichung (TW); Meng-Huang Liu, Hsinchu (TW); Shin Su, Banchiau (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/225,160

(22) Filed: Aug. 22, 2002

(30) Foreign Application Priority Data

Jul. 1, 2002 (TW) ........................ 91114573 A

(51) Int. Cl.[7] .............................. H03K 5/08; H03L 5/00
(52) U.S. Cl. .................. 327/310; 327/313; 327/328; 361/91.1
(58) Field of Search .................. 327/310, 311, 327/312, 313, 318, 319, 320, 322, 323, 325, 327; 361/91.1, 91.2, 91.5

(56) References Cited

U.S. PATENT DOCUMENTS

| | | | | |
|---|---|---|---|---|
| 5,892,262 A | * | 4/1999 | Wu et al. | .................... 257/356 |
| 6,275,089 B1 | * | 8/2001 | Song et al. | ................. 327/314 |
| 6,411,480 B1 | * | 6/2002 | Gauthier et al. | .............. 361/56 |
| 6,462,601 B1 | * | 10/2002 | Chang et al. | ................ 327/313 |

* cited by examiner

Primary Examiner—Tuan T. Lam
(74) Attorney, Agent, or Firm—Rabin & Berdo, P.C.

(57) ABSTRACT

A substrate pump circuit and method for I/O ESD protection including NMOS fingers connected to the interconnection between an I/O pad and an internal circuit comprises a MOS device connected to the interconnection between the I/O pad and the internal circuit and the substrate under the control of a switch to turn it on to conduct a pumping current through the substrate resistor when the I/O pad is under ESD stress, so as to pull up the potential of the substrate adjacent to the NMOS fingers, resulting in the reduction of the triggering voltage of the NMOS fingers.

15 Claims, 5 Drawing Sheets

SUBSTRATE PUMP CIRCUIT AND METHOD FOR I/O ESD PROTECTION

FIELD OF THE INVENTION

The present invention relates generally to an electrostatic discharge (ESD) protection for integrated circuit (IC), and more specifically to a substrate pump circuit and method for input/output (I/O) ESD protection in an integrated circuit.

BACKGROUND OF THE INVENTION

Complementary metal-oxide-semiconductor (CMOS) integrated circuit devices are vulnerable to ESD induced failure. Especially, the applications of thin gate oxide, short channel and shallow junction for high integration density as well as the lightly doped drain (LDD) and self-aligned silicide (salicide) further degrade the performance of MOS devices against ESD. Various techniques have been disclosed to self-protect output buffers or other I/O pads against ESD failures. Some of these measures include diode clamps, lateral punch-through devices and guard ring collectors around an I/O pad, and these circuits are reasonably effective to protect the integrated circuit devices.

ESD protection structures are classified into two categories including structures to protect input buffers and structures to protect output buffers and I/O pads. Protection of input buffers is relatively simple because a CMOS gate does not conduct current. Accordingly, a special protection structure is implemented on the input buffer that restricts the gate voltage of a transistor to a maximum breakdown voltage. To the contrary, the other category of output buffers and I/O pads includes structures that are more difficult to protect. This difficultly results from that the output buffer may conduct current by ESD stress and thus may be damaged. The protection structure must be designed and layout constructed so that the protection structure discharges the ESD stress without self-damage while the output buffer conducts only a minimum current under ESD stress conditions. Two well-known ESD protection structures substantially utilize the transistor turn-on mechanism and the transistor snapback mechanism in the protection circuit, where the former is characteristic of the threshold voltage for channel conduction, and the latter is characteristic of the transistor breakdown voltage. The more popular snapback mechanism is the introduction of an ESD protection structure such as NMOS transistors onto the interconnection between the I/O pad and the internal or core circuit. Upon ESD event, the internal circuit is protected by bypassing of the built-in parasitic bipolar transistors. To release large amount of ESD current by the NMOS transistors without excessive gate width structure, fingers layout is employed for the ESD protection circuit. Unfortunately, the fingers of NMOS transistors are hardly to turn on uniformly due to the inherent structure difference resulted from the fingers arrangement, resulting in that the ESD current will concentrate in a small region and thus burn out the device. As such, even a large ESD protection device will not have acceptable performance. In other proposed solutions substrate pump circuit is used to lower the triggering voltage of NMOS fingers, in order to enhance the turn-on uniformity. To pump the substrate potential, a pumping apparatus has to be turned on before the ESD protection circuit is turned on during an ESD event. However, the pumping transistor may be damaged by the ESD current if its width is small, thus the pumping transistor must be large enough to support the ESD current and the substrate pump circuit will consequently consume a large chip area, which is disadvantageous to scale down and cost down. It is therefore desired a substrate pump circuit of small size for I/O ESD protection.

SUMMARY OF THE INVENTION

One object of the present invention is to provide a substrate pump circuit and method for I/O ESD protection including NMOS fingers connected to the interconnection between an I/O pad and an internal circuit, by which an unused PMOS finger in an integrated circuit serves as a pumping apparatus and is turned on to conduct a pumping current through the substrate resistor to a ground pad during an ESD event to thereby pull up the potential of the substrate adjacent to the NMOS fingers so as to reduce the triggering voltage of the NMOS fingers.

In a preferred embodiment, according to the present invention, the NMOS fingers for ESD protection are connected to the interconnection between the I/O pad and the internal circuit, the base of the NMOS fingers is grounded to a ground pad via the substrate resistor, the source of the PMOS finger is connected to the interconnection between the I/O pad and the internal circuit, and its drain is connected to the base of the NMOS finger, and a switch is connected to the gate of the PMOS finger. During normal operation, the PMOS finger is turned off by the switch. When an ESD event happens and causes the voltage on the I/O pad to rise rapidly, the PMOS finger is turned on by the switch to conduct a small ESD current to pump the substrate, and hence the NMOS fingers are turned on uniformly and release most of the ESD current.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
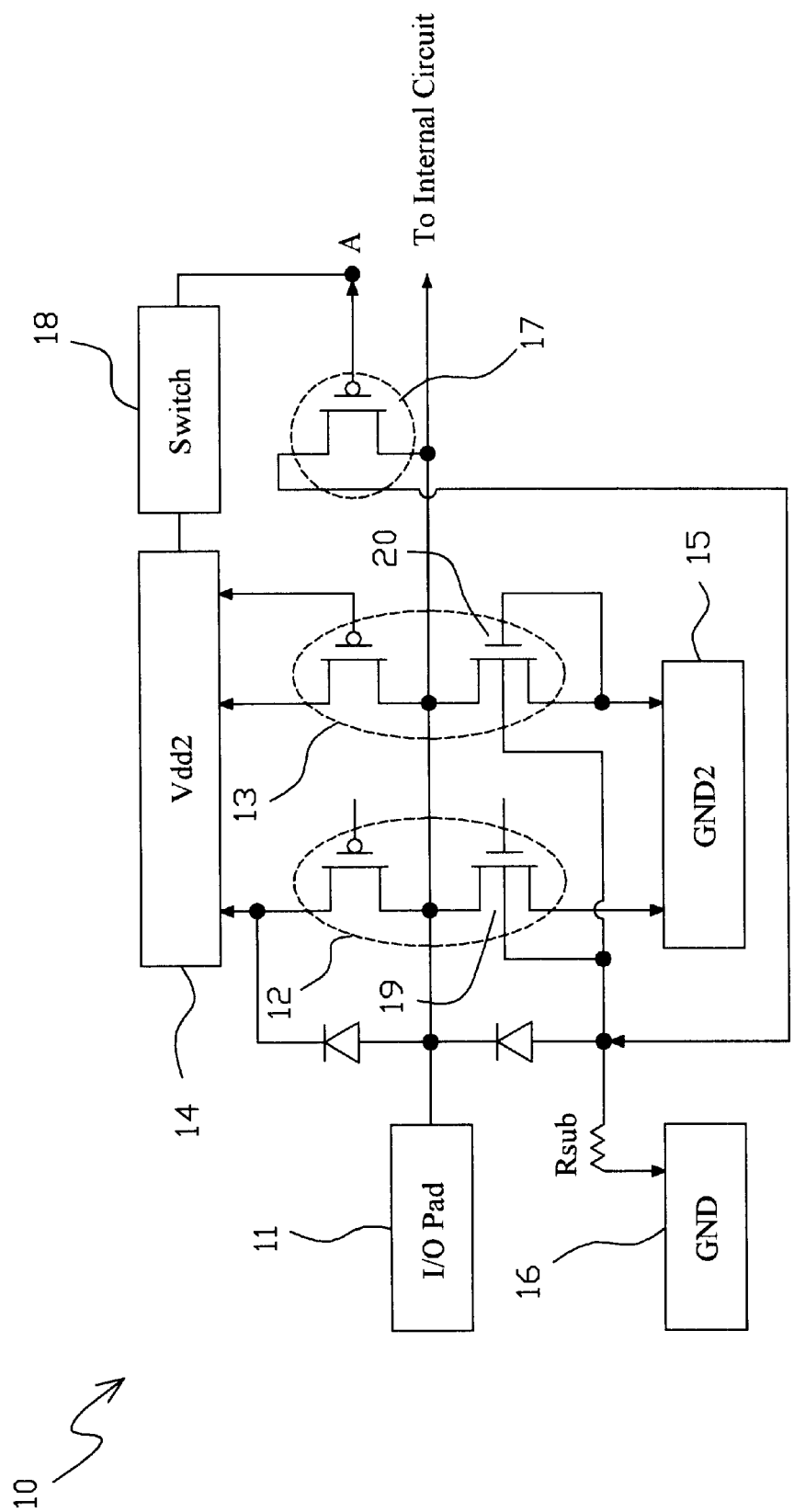
FIG. 1 is a preferred embodiment according to the present invention.

FIG. 1 shows a preferred embodiment according to the present invention, where a self-protect output driver circuit 10 includes an ESD finger 13 in addition to an output driver 12 connected to the interconnection between I/O pad 11 and the internal circuit, the power supply 14 and ground 15 in order to release ESD current from the I/O pad 11 during an ESD event. The base of the NMOS fingers 19 and 20 in the output driver 12 and the ESD finger 13 are grounded to ground pad 16 through the substrate resistor $R_{sub}$, an unused PMOS finger 17 has its source connected to the interconnection between the I/O pad 11 and the internal circuit, its drain connected to the interconnection between the substrate resistor $R_{sub}$ and the base of the NMOS fingers 19 and 20, and its gate connected to node A that is connected to a switch 18 so as to determine the voltage applied on the PMOS finger 17 and consequently to control the PMOS finger 17 to be turned on and turned off.

When the I/O pad 11 is stressed by a positive current during an ESD event, the voltage on the I/O pad 11 will increase rapidly and the voltage on the node A will be lower than that on the I/O pad 11 by a voltage drop that is larger than the absolute value of the threshold voltage $V_t$ of the PMOS finger 17. Thus the PMOS pumping apparatus 17 will be turned on first because its source to gate voltage difference $V_{sg}>|V_t|$, and hence conducts a current through the substrate resistor $R_{sub}$ to the ground pad 16. As a result, the potential of the base adjacent to the NMOS fingers 19 and 20 is pulled up, thereby lowering the triggering voltage of the NMOS fingers 19 and 20.

Figure 2A:
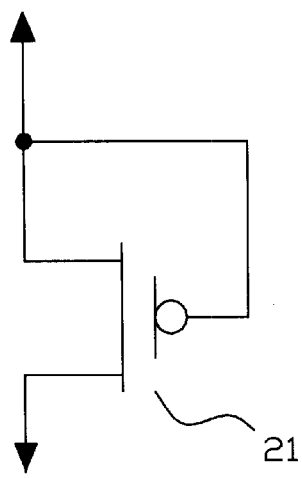
FIGS. 2A–2D show four devices in the I/O pad.
Figure 2B:
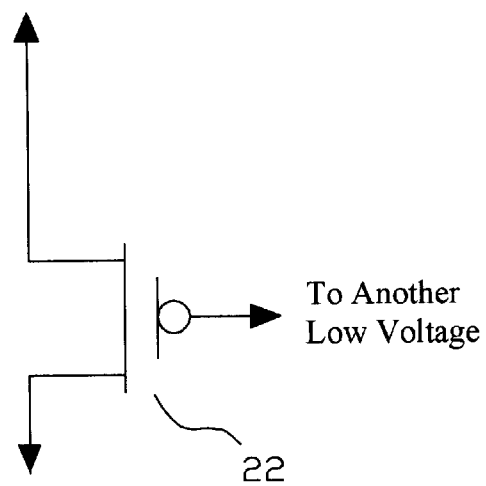
Figure 2C:
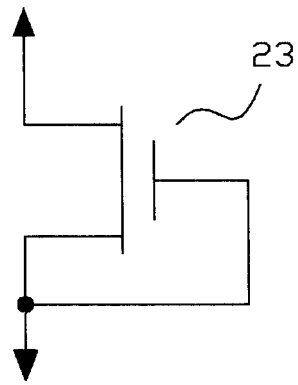
Figure 2D:
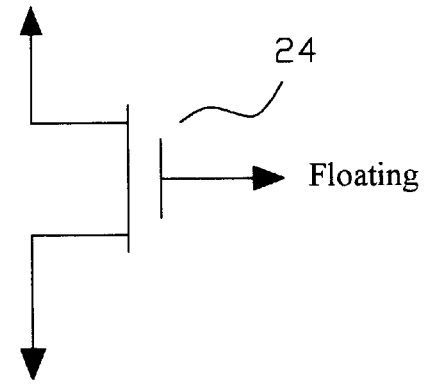

For more clear illustration, FIGS. 2A–2D show four devices in an I/O pad. FIG. 2A shows an off PMOS transistor 21, whose drain is connected to a low voltage, and whose gate and source are connected together to a high voltage. FIG. 2B shows an on PMOS transistor 22, whose drain is connected to a low voltage, whose source is connected to a high voltage, and whose gate is connected to another low voltage. FIG. 2C shows a grounded-gate NMOS transistor 23, whose source and gate both are connected to a low voltage, and whose drain is connected to a high voltage. FIG. 2D shows a floating gate NMOS transistor 24, whose source and drain are connected to a low and a high voltage, respectively, and whose gate is floating.

Figure 3:
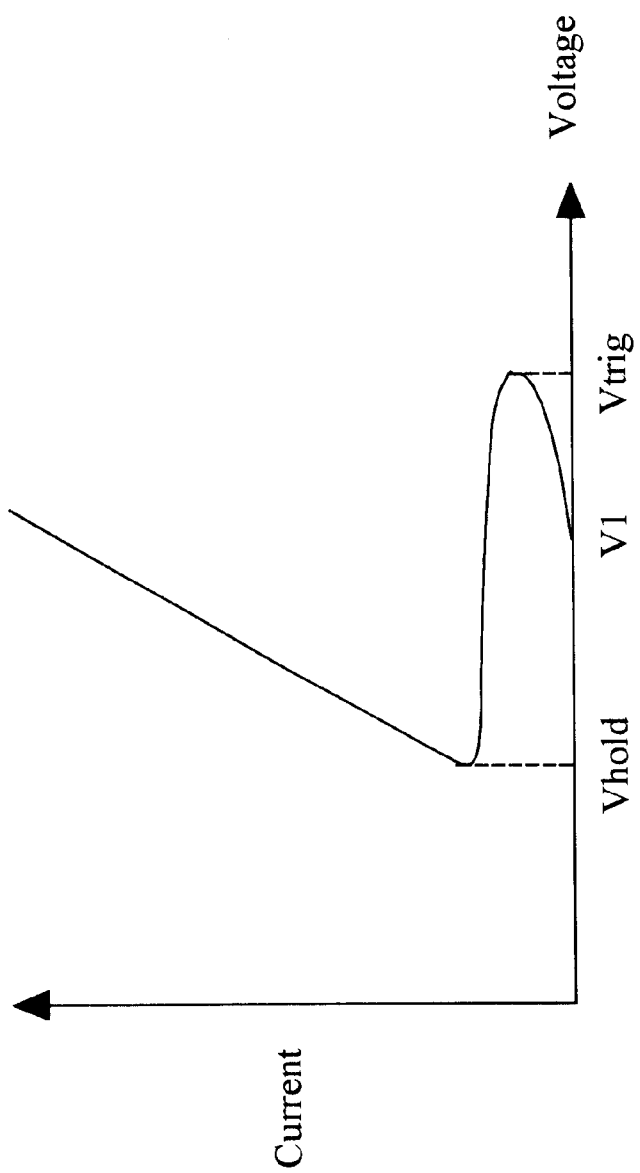
FIG. 3 is the current-voltage (I–V) curve of an ESD protection device.

Before the operation theory of the devices shown in FIGS. 2A–2D is explained, the snapback I–V curve of an ESD device is provided in FIG. 3. When the voltage gradually increases from $V_1$, the current will increase accordingly until the triggering voltage $V_{trig}$ is reached, then the voltage drops quickly while the current does not change so much after the triggering point is overcome, and this trend remains until the voltage decreases to the holding voltage $V_{hold}$, and afterwards the current increases rapidly with further increasing of the voltage. During an ESD event, the smaller the triggering voltage $V_{trig}$, the earlier the device is triggered.

Figure 4:
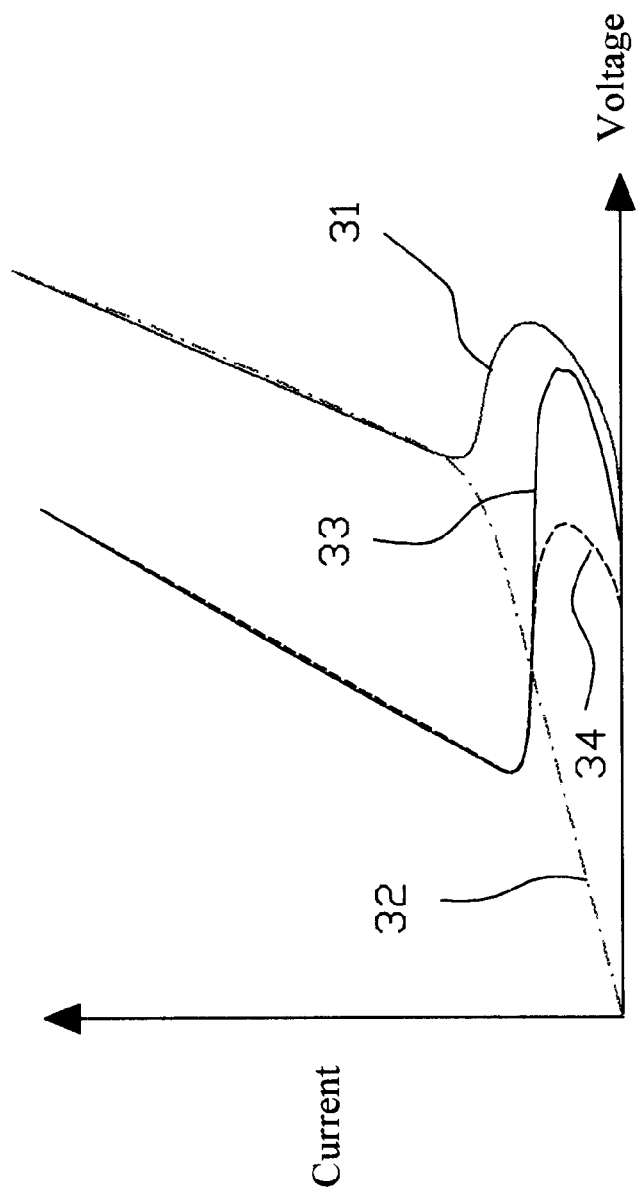
FIG. 4 shows the respective I–V curves of the devices shown in FIGS. 2A–AD.

FIG. 4 shows the corresponding I–V curves of the four devices shown in FIG. 3, of which curve 31 is illustrated for the off PMOS transistor 21 in FIG. 2A, curve 32 corresponds to the on PMOS transistor 22 in FIG. 2B, curve 33 is the I–V curve of the ground-gate NMOS transistor 23 in FIG. 2C, and curve 34 is shown for the floating gate NMOS transistor 24 in FIG. 2D. During an ESD event, from the curves in FIG. 4, the triggering voltage of the floating gate NMOS transistor 34 is lower than that of the grounded-gate NMOS transistor, thus the used NMOS fingers whose gate is floating during an ESD event will be turned on first and conduct most of the ESD current, and then be damaged at the lower level due to the hardly-turn-on of the unused NMOS fingers whose gate is grounded. From other prior art techniques, pumping the substrate can lower the triggering voltage of the used and unused NMOS fingers to a similar voltage level, making them turned on more uniformly, and consequently improves the ESD performance of an I/O pad.

As shown in FIG. 1, the substrate pump circuit 10 includes PMOS transistor 17 and switch 18 that provides a high voltage during normal operation to turn off the PMOS transistor 17 and a low voltage during an ESD event to turn on the PMOS transistor 17. Hence the substrate pump circuit 10 is off during normal operation and is on during an ESD event. As shown in FIG. 4, the off PMOS transistor 31 has a higher triggering voltage than those of the NMOS transistors 33 and 34, therefore the PMOS transistor 17 will not be turned on during normal operation. During an ESD event, however, the switch 18 will lower the gate voltage of the PMOS transistor 17 relatively to turn it on, and further cause the PMOS transistor 17 to drain some ESD current to pull up the potential of the substrate by a pumping current flowing through the substrate resistor $R_{sub}$ to the ground pad 16 until the turn-on voltage of the PMOS transistor 17 is higher than the triggering voltage of the NMOS transistors. For the turn-on voltage of the PMOS transistor 17 will increase with the increasing of the ESD current, it will eventually be large enough to trigger the NMOS fingers, and most of the ESD current is thus drained through the NMOS fingers once the NMOS fingers are triggered, such that the PMOS pumping apparatus 17 will not be damaged by the ESD current because most of the ESD current flows through the NMOS fingers. From the curve 32 in FIG. 4, PMOS transistor 32 can maintain its on state before NMOS transistor 33/34 reaches their triggering voltages and thus be turned on, hence the PMOS transistor 17 in FIG. 1 has guaranteed effectiveness and the situation where it is not turned on will not happen.

Figure 5A:
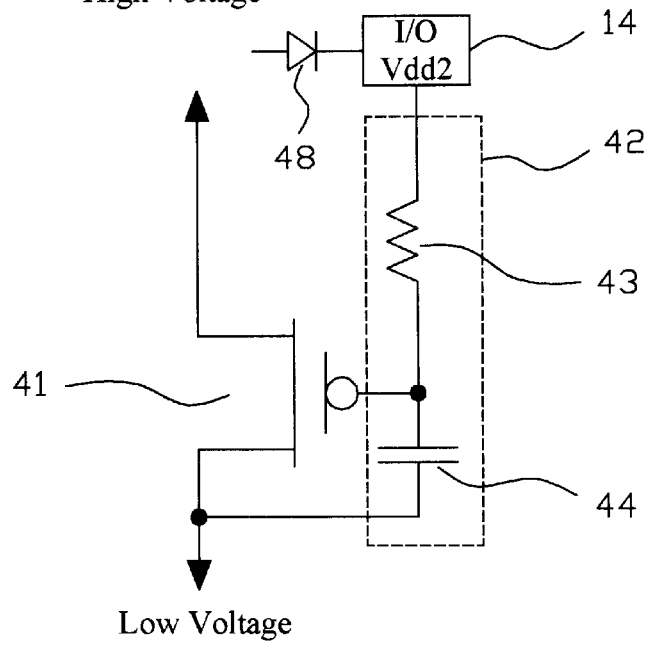
FIGS. 5A–5B show two embodiment circuits for the switch shown in FIG. 1.
Figure 5B:
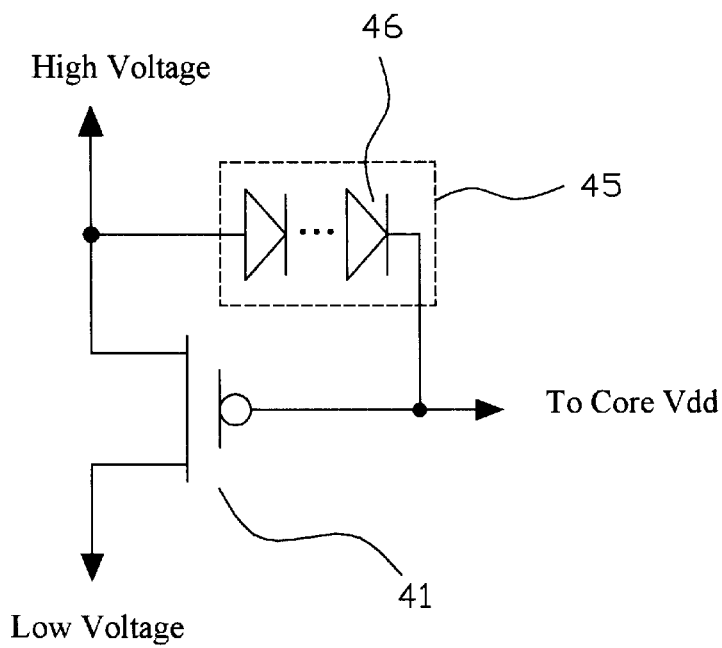

FIGS. 5A–5B show two embodiment circuits for the switch 18 in FIG. 1, in which PMOS transistor 41 represents the PMOS transistor 17 in FIG. 1. In FIG. 5A, the source and drain of the PMOS transistor 41 are connected to a high voltage and a low voltage, respectively, switch 42 includes resistor 43 and capacitor 44 in series and connected between the I/O pad supply voltage Vdd2 14 and the low voltage, the high voltage connected with the PMOS transistor 41 is connected to the I/O Vdd2 14 through diode 48, and the gate of the PMOS transistor 41 is connected between the resistor 43 and capacitor 44. During normal operation, the high voltage charges the capacitor 44 through the resistor 43 to maintain the gate of the PMOS transistor 41 at a high level, and hence the PMOS transistor 41 is turned off. When the voltage on the source of the PMOS transistor 41 increases rapidly, the voltage difference between the gate and source of the PMOS transistor 41 will increase to turn on the PMOS transistor 41 because the potential of the gate cannot follow in time due to the RC time delay. In FIG. 5B, the source and drain of the PMOS transistor 41 are connected to a high and low voltage, respectively, its gate is connected to the supply voltage VDD of the core circuit, switch 45 includes diode string 46 connected between the high voltage and the gate of the PMOS transistor 41, so that the PMOS transistor 41 is kept off except when the voltage on the source of the PMOS transistor 41 is raised until its threshold voltage is overcome. Though this circuit is illustrated for example, other circuits capable of keeping PMOS transistor off and turning it on after its source voltage increases can be used for implementation of the switch 18, and those skilled in the art can easily modify it in accordance with the embodiment circuits. In other variations of the circuit, a switch can be utilized in the current invented circuit if it can turn off the PMOS transistor 17 during normal operation and turn on the PMOS transistor 17 during the ESD event.

According to the present invention, there is only a small-sized MOS transistor, preferably an unused PMOS finger, to provide a sufficient pumping apparatus, and furthermore, because of its high holding voltage, it will not be damaged by the ESD current.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A substrate pump circuit for I/O ESD protection including a plurality of NMOS fingers connected to an I/O pad on a substrate, the substrate pump circuit comprising:

a resistor connected between a base of the NMOS fingers and a ground pad;

a pumping apparatus connected to the base of the NMOS fingers; and a switch for controlling the pumping apparatus to conduct a pumping current through the resistor during an ESD event.

2. A substrate pump circuit according to claim 1, wherein the resistor comprises a substrate resistor.

3. A substrate pump circuit according to claim 1, wherein the pumping apparatus comprises a PMOS transistor.

4. A substrate pump circuit according to claim 3, wherein the PMOS transistor comprises a MOS finger.

5. A substrate pump circuit according to claim 3, wherein the PMOS transistor comprises a source connected to the I/O pad, a drain connected to the base of the NMOS fingers, and a gate connected to the switch.

6. A substrate pump circuit according to claim 1, wherein the switch comprises an RC circuit.

7. A substrate pump circuit according to claim 1, wherein the switch comprises a diode string.

8. A method for I/O ESD protection including a plurality of NMOS fingers connected to an I/O pad on a substrate, the method comprising the steps of:

connecting a resistor between a base of the NMOS fingers and a ground pad; and conducting a pumping current through the resistor during an ESD event.

9. A method according to claim 8, further comprising forming the resistor with a substrate resistor.

10. A method according to claim 8, further comprising turning on a MOS device for providing the pumping current.

11. A method according to claim 10, wherein the MOS device is a PMOS transistor.

12. A method according to claim 11, wherein the PMOS transistor comprises a MOS finger.

13. A method according to claim 11, further comprising connecting a source and a drain of the PMOS transistor to the I/O pad and the base of the NMOS fingers, respectively.

14. A method according to claim 8, further comprising connecting a switch for controlling the pumping current.

15. A method according to claim 8, wherein the pumping current is conducted before the NMOS fingers are triggered.

* * * * *